United States Patent [19]
Sasaki

[11] Patent Number: 5,578,943
[45] Date of Patent: Nov. 26, 1996

[54] SIGNAL TRANSMITTER AND APPARATUS INCORPORATING SAME

[75] Inventor: Lawrence H. Sasaki, Oxford-on-Rideau, Canada

[73] Assignee: Bell-Northern Research Ltd., Ottawa, Canada

[21] Appl. No.: 368,945

[22] Filed: Jan. 5, 1995

[51] Int. Cl.⁶ .............................................. H03K 19/0175
[52] U.S. Cl. ............................ 326/86; 326/83; 327/103
[58] Field of Search ...................... 326/86, 83; 327/103

[56] References Cited

U.S. PATENT DOCUMENTS

| | | | |
|---|---|---|---|
| 4,797,583 | 1/1989 | Ueno et al. | 326/86 |
| 4,825,099 | 4/1989 | Barton | 326/86 |
| 4,890,010 | 12/1989 | Neudeck | 326/86 |
| 4,961,009 | 10/1990 | Baik | 327/103 |
| 5,012,137 | 4/1991 | Muellner | 326/86 |
| 5,019,728 | 5/1991 | Sanwo | 326/86 |
| 5,355,391 | 10/1994 | Horitz | 326/86 |
| 5,418,478 | 5/1995 | Van Brunt | 326/86 |
| 5,448,190 | 9/1995 | Etoh | 327/103 |

OTHER PUBLICATIONS

"Low-Power Chip-To-Chip Communication Circuits", Tan et al, IEE Electronics Letters, 13th Oct. 1994, vol. 30, No. 21, pp. 1732–1733.

Primary Examiner—David R. Hudspeth
Assistant Examiner—Andrew Sanders

[57] ABSTRACT

An apparatus includes an IC chip with a signal transmitter and an IC chip with a signal receiver, both chips being mounted on a printed circuit board and being connected via conductors on the board. The signal transmitter has a voltage-current converter and a high output impedance current amplifier. The signal receiver has a current-voltage converter. The voltage-current converter converts the voltage of the digital signal to current which in turn is amplified by the high output impedance current amplifier. The amplified current flows via the conductors in the receiver. The digital signal is transferred via the conductors on the current basis. Due to the transmission of the digital signal of current from the signal transmitter to the signal receiver via the conductors, signal spikes while transmitting are reduced and noise immunity is improved. Also, EMI (electromagnetic interference) emission is reduced and power dissipation is small.

12 Claims, 4 Drawing Sheets

SIGNAL TRANSMITTER AND APPARATUS INCORPORATING SAME

TECHNICAL FIELD

The present invention relates to a signal transmitter for transferring digital signals and a signal receiver for receiving digital signals and an apparatus having a signal transmitter and a signal receiver connected via conductors.

BACKGROUND ART

In modern high-speed digital systems, many digital IC chips are mounted on a printed circuit board. These may include a signal transmitter IC chip and a signal receiver IC chip which are connected via wired lines (printed circuit lines). With increased circuit density and signal speed, the performance of the driver included in the transmitter IC chip is crucial to meet the requirements of timing margin, signal integrity, noise immunity, low electromagnetic interference (EMI) emissions, low cross-talk, and low power dissipation. Preferably, the driver is single-ended rather than differential thereby reducing the pin count and power dissipation.

Existing digital driver designs meet some but not all of the above mentioned criteria. Typical CMOS and TTL drivers have large voltage swings. Consequently they tend to be noisy and exhibit very high power dissipation with moderate capacitive loads. Also, even with slew rate control, EMI emissions are relatively high and timing margins are inadequate for many applications. Although many of the criteria are met by typical ECL/CML (Emitter Coupled Logic/Current Mode Logic) drivers, power dissipation is very high.

U.S. Pat. No. 5,023,488 granted on Jun. 11, 1992 to William F. Gunning discloses a bidirectional transceiver having a driver and a receiver. The transceiver interfaces VLSI CMOS circuits to transmission lines via which a digital voltage signal is transmitted. Due to a high rise and fall time of the transmitted signal, large voltage spikes are present resulting in high EMI emissions and high power dissipation.

Another known technique is current loops (current out/current in). They have traditionally been used in noisy environments such as used with Teletype which is a low speed application. Another technique used in very high speed applications is the electro-optical interface of a laser diode transmitter and a photo diode receiver. This interface is expensive and consumes additional chip area.

SUMMARY OF THE INVENTION

It is an object of the present invention to provide an improved transmitter and receiver for transferring digital signals.

According to one aspect of the present invention, there is provided a signal transmitter for connection via a conductor to a signal receiver for transferring digital signals.

The signal transmitter comprises: means for providing a digital voltage in response to an input signal from a signal source; a voltage-current converter for converting the digital voltage to current and for providing a digital current; and a high output impedance current amplifier for causing an amplified digital current to flow in the conductor in response to the digital current provided by the voltage-current converter.

According to another aspect of the present invention, there is provided a signal receiver for connection via a conductor to a signal transmitter for receiving digital signals transferred from the signal transmitter via the conductor.

The signal receiver comprises: a current-voltage converter for converting the digital current flowing in the conductor to voltage and for providing a received digital voltage; and a receiving signal process means responsive to the received digital voltage.

According to another aspect of the present invention, there is provided an apparatus having a signal transmitter and a signal receiver which are connected via a conductor. The signal transmitter comprises: means for providing a digital voltage in response to an input signal fed from a signal source; a voltage-current converter for converting the digital voltage to current and for providing a digital current; and a high output impedance current amplifier for amplifying the digital current provided by the voltage-current converter and for causing an amplified digital current to flow in the conductor. The signal receiver comprises: a current-voltage converter for converting the amplified digital current flowing in the conductor to voltage and for providing a received digital voltage; and a receiving signal process means responsive to the received digital voltage signal to process it.

In one example of the present invention, the voltage-current converter converts the voltage of the digital signal to current in the signal transmitter. The current is amplified by the high output impedance current amplifier. The amplified current flows in the conductor which connects the transmitter and the signal receiver. The current is converted to a digital voltage signal in the receiver. Due to the transmission of the digital current signal from the signal transmitter to the signal receiver, EMI is reduced and power dissipation is also reduced.

BRIEF DESCRIPTION OF THE DRAWINGS

Embodiments of the present invention will be described with reference to the accompanying drawings, in which.

DETAILED DESCRIPTION

The following description assumes, for simplicity and purely by way of example, that the FETs referred to are MOS devices and a DC supply voltage Vd is 5.0 volts.

Figure 1:
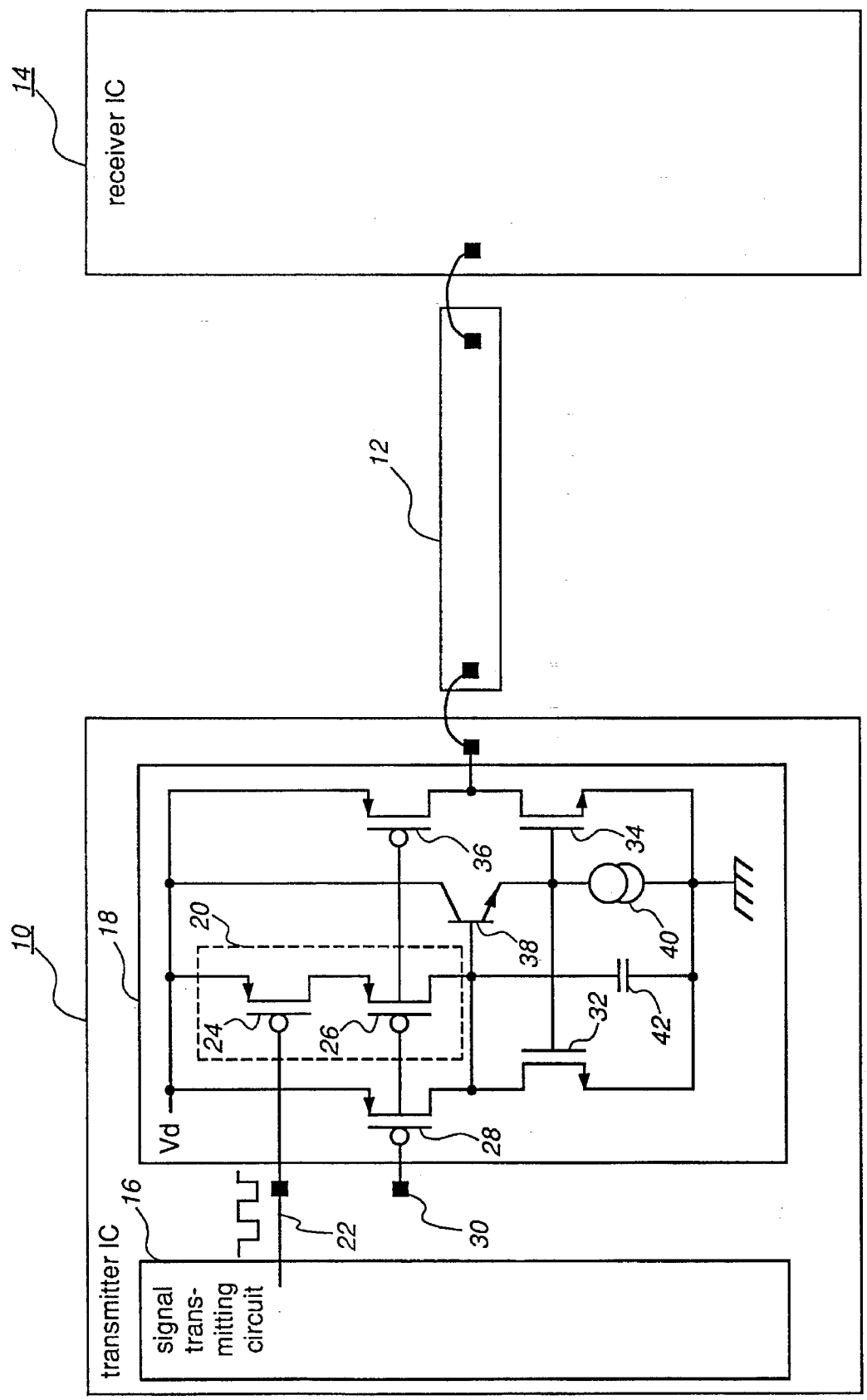
FIG. 1 illustrates a circuit diagram of an example of a signal transmitter according to the present invention.

Referring to FIG. 1, a transmitter IC 10 is connected via a conductor 12 to a receiver IC 14. The transmitter IC 10 transmits a digital signal of current basis and the receiver IC 14 receives the digital signal via the conductor 12. Both ICs 10 and 12 are discrete chips. The transmitter IC 10 has a signal transmitting circuit 16, a current driver circuit 18 and an interface circuit 20. The signal transmitting circuit 16 has a signal output line 22. The interface circuit 20 has two P-channel FETs 24 and 26 forming a totem pole circuit in which the drain of the FET 24 is connected to the source of the FET 26. The gate and source of the FET 24 are connected to the signal output line 22 of the signal transmitting circuit 16 and the supply voltage terminal, respectively.

The current driver circuit 18 is a current mirror circuit. The gate of a P-channel FET 28 is connected to a bias input terminal 30 to which a bias voltage is fed by a bias voltage source (not shown). The source and drain of the FET 28 are connected to the supply voltage terminal and the drain of an N-channel FET 32, respectively. The source and gate of the FET 32 are connected to the ground and the gate of an N-channel FET 34, respectively. The source and drain of the FET 34 are connected to the ground and the drain of a P-channel FET 36, respectively. The source of the FET 34 is connected to the supply voltage terminal. A buffer circuit having an N-type bipolar transistor 38 and a constant current source 40 is included in the current driver circuit 18. The collector-emitter circuit of the transistor 38 and the constant current source 40 are series-connected between the supply voltage terminal and the ground. The emitter of the transistor 38 is connected to the gates of the FETs 32 and 34. The base of the transistor 38 is connected to the junction of the drains of the FETs 28 and 32 and to the drain of the FET 26 of the interface circuit 20. The base of the transistor 38 is connected to the ground via a slew rate control capacitor 42. The gates of the FETs 26 and 36 are connected to the bias input terminal 30. The junction of the drains of the FETs 34 and 36 (the output terminal of the current driver circuit 18) is connected to the conductor 12 which is connected to the receiver IC 14.

The supply voltage Vd is fed to the voltage supply terminal and a bias voltage is fed to the bias input terminal 30. The current driver circuit 18 operates as a current mirror circuit. When an input signal is not fed from a signal source (not shown), no output signal is provided to the signal output line 22 by the signal transmitting circuit 16 (high level voltage and "0" logic state). The FET 24 of the interface circuit 20 is non-conductive and current does not flow in the FETs 24 and 26. A constant current flows in the FETs 28 and 32 of the current driver circuit 18, in response to the bias voltage which is fed to the bias input terminal 30. While a small amount of current (quiescent current) flows in the FET 34, because the bias voltage is fed to the gate of the FET 36, the FET 36 cancels the quiescent current. No current is supplied to the conductor 12 ("0" logic state).

When an input signal is fed from the signal source, the signal transmitting circuit 16 provides a digital voltage (i.e., a digital signal of voltage basis) on the signal output line 22 (low level voltage and "1" logic state), in response to the input signal. The interface circuit 20 converts the digital voltage to current and provides a digital current (i.e., a digital signal of current basis) to the current driver circuit 18. The current driver circuit 18 amplifies the digital current and supplies the amplified digital current to the conductor 12. During the "1" logic state, the FET 24 is conductive and the current flowing in the FETs 24 and 26 is sunk into the FET 32. In response to the increased current flowing in the FET 32, amplified current flows in the FET 34. In a case where the ratio of gates of the FETs 32 and 34 is 1:10, for example, a current of 100 µA flowing in the FET 32 results in the output current of 1 mA flowing in the FET 34. The amplified current flows in the conductor 12. The output impedance of the current driver circuit 18 is high in the current operation mode.

Figure 2:
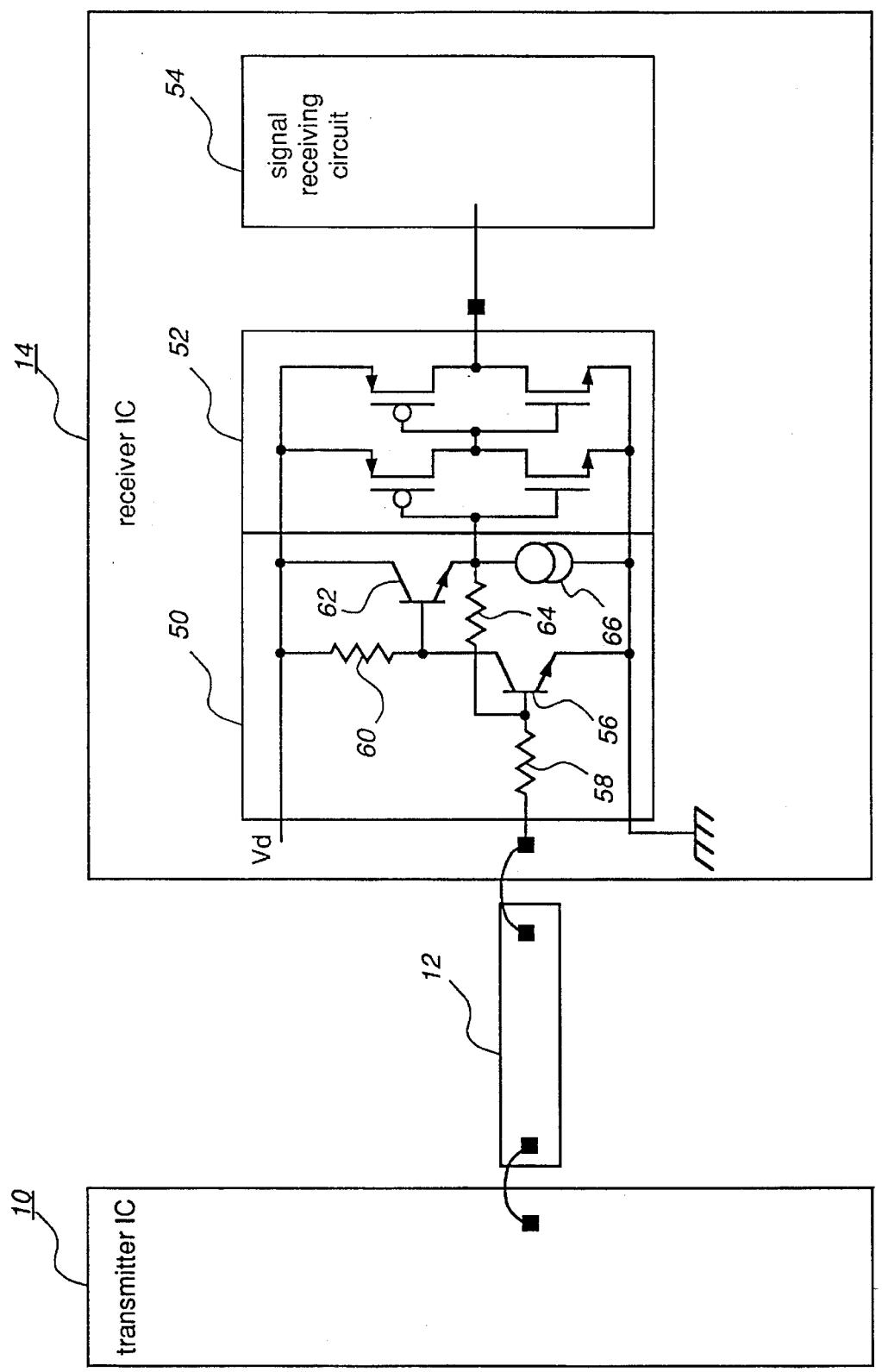
FIG. 2 illustrates a circuit diagram of an example of a signal receiver according to the present invention.

Referring to FIG. 2, the receiver IC 14 has a current-voltage converter 50, a voltage buffer circuit 52 and a signal receiving circuit 54. The current-voltage converter 50 is a transimpedance amplifier. The base, collector and emitter of an N-type bipolar transistor 56 are connected to the conductor 12 via a resistor 58, to the supply voltage terminal via a resistor 60 and to the ground, respectively. The base of another N-type bipolar transistor 62 is connected to the collector of the transistor 56. The emitter of the transistor 62 is connected to the base of the transistor 56 via a resistor 64 and to the ground via a constant current source 66. The collector of the transistor 62 is connected to the supply voltage terminal. The junction of the emitter of the transistor 62 and the constant current source 66 is the output terminal of the current-voltage converter 50 and connected to the voltage buffer circuit 52. The voltage buffer circuit 52 has a two stage CMOS buffer. Each stage is a well-known CMOS inverter which has P-channel and N-channel FETs. The output terminal of the voltage buffer circuit 52 is connected to the input of the signal receiving circuit 54. The input impedance of the current-voltage converter 50 is low (50 Ω) and the resistor 58 is added to better match the current-voltage converter 50.

In the current-voltage converter 50, the emitter of the transistor 62 is pulled by the constant current source 66. During the "1" logic state in the current driver circuit 18 of the transmitter IC 10, the amplified current flows via the transistor 62, the resistor 64, the resistor 58, the conductor 12 and the drain-source of the FET 34 of the current driver circuit 18. The amplified current results in an increased voltage across the resistor 64. In such a manner, the current-voltage converter 50 converts the digital current which flows in the conductor 12 and provides a received digital voltage to the voltage buffer circuit 52. The voltage buffer circuit 52 adjusts the voltage level of the digital voltage provided by the current-voltage converter 50, so that the adjusted voltage level meets the required voltage level of the signal receiving circuit 54. The signal receiving circuit 54 processes the received digital voltage fed by the voltage buffer circuit 52. The voltage drop across the resistor 64 is fed via the voltage buffer circuit 52 to the signal receiving circuit 54 which in turn process the digital voltage. Because of the low input impedance of the current-voltage converter 50 and current input thereto, noise immunity is high and voltage spikes are small.

Figure 3:
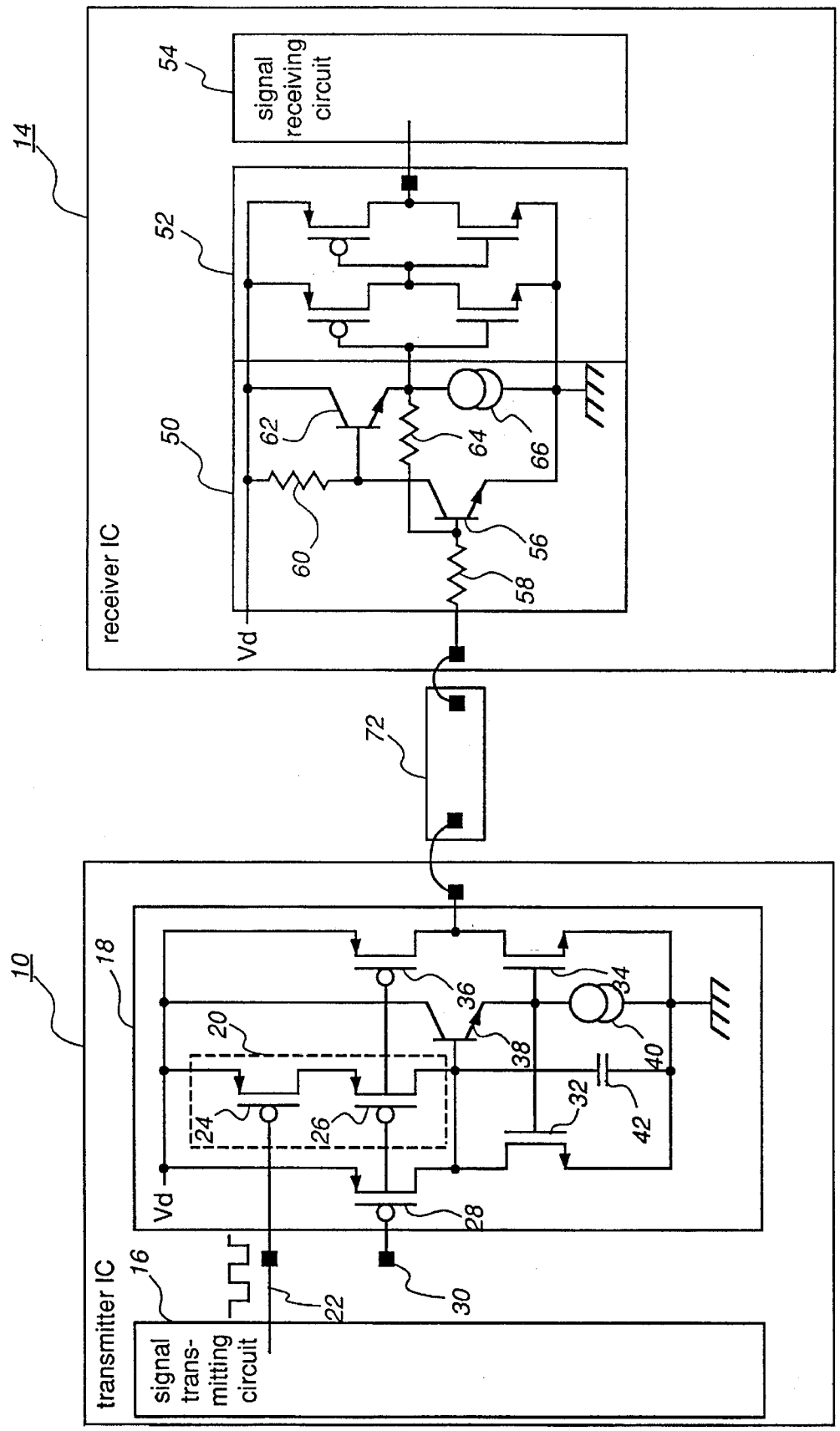
FIG. 3 illustrates a circuit diagram of an embodiment of an apparatus having a signal transmitter and a signal receiver according to the present invention.

Referring to FIG. 3, the transmitter IC 10 and the receiver IC 14 are mounted on the same printed circuit board (not shown) and the transmitter IC 10 and receiver IC 14 are connected by a conductor 72 of the printed circuit board. The circuit configuration and operation of the transmitter IC 10 and receiver IC 14 are the same as those shown in FIGS. 1 and 2. Due to low level current, the voltage swings encountered are small, typically 60 mVp-p, thereby EMI level is low. Because of current drive circuit, power dissipation is small, typically 10 mW.

Figure 4:
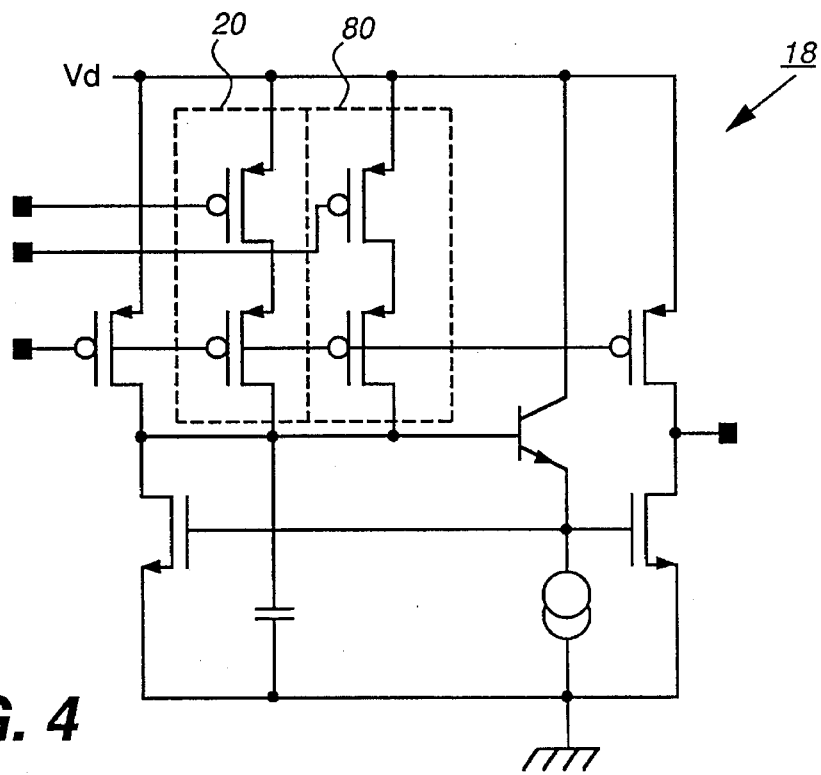
FIG. 4 illustrates a circuit diagram of another example of the current driver shown in FIG. 1.

FIG. 4 shows another example of the interface circuit 20, in which another totem pole circuit is added to the current driver circuit 18, the circuit having the same configuration. Because of two input terminals of the current driver circuit 18 and an interface circuit 80, they can achieve a multi-level voltage-current conversion.

Figure 5:
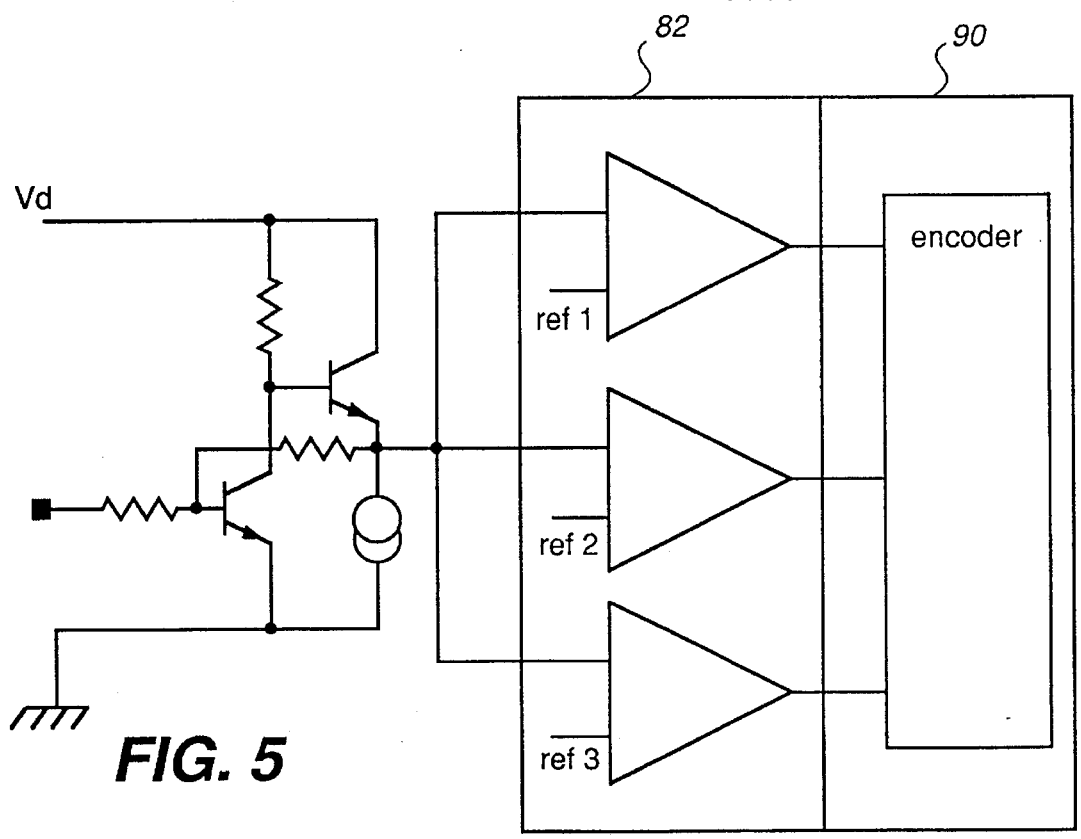
FIG. 5 illustrates a circuit diagram of another example of the current-voltage converter shown in FIG. 2.

FIG. 5 shows another example of the receiver IC, in which a voltage comparator circuit 82 having a plurality of voltage comparators can provide a multi-level encoding with an encoder 90.

It should be noted that the FETs' amplifier ratio will depend, to some extent, upon the physical size of the design and/or the manufacturing process. The voltages, potentials and polarity of the FETs described here are only examples.

What is claimed is:

1. A signal transmitter for connection via a conductor to a signal receiver for transferring digital signals, the signal transmitter comprising:

means for providing a digital voltage in response to an input signal from a signal source;

a voltage-current converter for converting the digital voltage to current and for providing a digital current, the voltage-current converter including a totem pole circuit of two transistors, the digital voltage being fed to the input terminal of one of the two transistors and a bias voltage being fed to the input terminal of the-other transistor of the two transistors; and a high output impedance current amplifier for causing an amplified digital current to flow in the conductor in response to the digital current provided by the voltage-current converter, the current amplifier including a current mirror circuit having an input current transistor and an output current transistor, current flowing in both transistors in response to the bias voltage, the digital current from the voltage-current converter being fed to the current input transistor, so that current flows in the input current transistor in response to the digital current and the current flowing in the output current transistor is an amplified current of the digital current, the amplified current flowing in the conductor.

2. The signal transmitter of claim 1, further comprising at least one totem pole circuit having two transistors, wherein different digital currents are fed to the input terminal of one transistor of each totem pole circuit and the bias voltage is fed to the input terminal of the other transistor of each totem pole circuit.

3. The signal transmitter of claim 1, wherein the current mirror circuit further comprises a buffer circuit having a current source which drives the input and output current transistors of the current mirror circuit.

4. The signal transmitter of claim 1, wherein the transistors of the current mirror circuit and the totem pole circuit are FETs (field effect transistors).

5. The signal transmitter of claim 1, wherein the transistors of the totem pole circuit are FETs.

6. An apparatus having a signal transmitter and a signal receiver which are connected via a conductor, the signal transmitter comprising:

means for providing a digital voltage in response to an input signal from a signal source;

a voltage-current converter for converting the digital voltage to current and for providing a digital current, the voltage-current converter including a totem pole circuit of two transistors, the digital voltage being fed to the input terminal of one of the two transistors and a bias voltage being fed to the input terminal of the other transistor of the two transistors; and a high output impedance current amplifier for causing an amplified digital current to flow in the conductor in response to the digital current provided by the voltage-current converter, the current amplifier including a current mirror circuit having an input current transistor and an output current transistor, current flowing in both transistors in response to the bias voltage, the digital current from the voltage-current converter being fed to the current input transistor, so that current flows in the input current transistor in response to the digital current and the current flowing in the output current transistor is an amplified current of the digital current, the amplified current flowing in the conductor, and the signal receiver comprising:

a current-voltage converter for converting the amplified digital current flowing in the conductor to voltage and for providing a received digital voltage; and a receiving signal process means responsive to the received digital signal of voltage basis to process it.

7. The apparatus of claim 6, wherein the voltage-current converter further includes a plurality of totem pole circuits, each having two transistors, wherein different digital currents are fed to the input terminal of one transistor of each totem pole circuit and the bias voltage is fed to the input terminal of the other transistor of each totem pole circuit.

8. The apparatus of claim 6, wherein the current mirror circuit further comprises a buffer circuit having a current source which drives the input and output current transistors of the current mirror circuit.

9. The apparatus of claim 6, wherein the signal receiver further comprises buffer means for adjusting the voltage level of the voltage output signal provided by the current-voltage converter, so that the adjusted voltage level meets the required voltage level of the receiving signal process means.

10. The apparatus of claim 6, wherein the signal receiver further comprises multi level converter for providing a plurality of different voltages to the receiving signal process means in response to the digital voltage provided by the current-voltage converter.

11. The apparatus of claim 6, wherein the transistors of the current mirror circuit are FETs.

12. The apparatus of claim 6, wherein the transistors of the totem pole circuit are FETs.

* * * * *